United States Patent [19]
Yeap et al.

[11] Patent Number: 6,087,209
[45] Date of Patent: *Jul. 11, 2000

[54] FORMATION OF LOW RESISTANCE, ULTRA SHALLOW LDD JUNCTIONS EMPLOYING A SUB-SURFACE, NON-AMORPHOUS IMPLANT

[75] Inventors: Geoffrey Choh-Fei Yeap, Austin, Tex.; Akif Sultan, Santa Clara; Shekhar Pramanick, Fremont, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/126,775

[22] Filed: Jul. 31, 1998

[51] Int. Cl.[7] .................................................. H01L 21/336

[52] U.S. Cl. .......................... 438/197; 438/301; 438/231; 148/DIG. 53

[58] Field of Search ...................................... 438/174, 231, 438/232, 301, 305, 306; 148/DIG. 57

[56] References Cited

U.S. PATENT DOCUMENTS

| | | |
|---|---|---|
| 4,683,645 | 8/1987 | Naguib et al. . |
| 4,835,112 | 5/1989 | Pfiester et al. . |
| 5,362,670 | 11/1994 | Iguchi et al. . |
| 5,602,045 | 2/1997 | Kimura . |
| 5,654,210 | 8/1997 | Aronowitz et al. . |
| 5,710,055 | 1/1998 | Kizilyalli . |
| 5,770,485 | 6/1998 | Gardner et al. . |
| 5,858,864 | 1/1999 | Aronowitz et al. . |

FOREIGN PATENT DOCUMENTS

WO 85/00694  2/1985  WIPO .

OTHER PUBLICATIONS

"Drain–Engineered Hot–Electron–Resistan Device Structures: A Review" (IEEE), pp 1125–1132, 1989.

"Eliminating channeling tail by lower dose preimplantation", (Appl. Phys. Lett 56 (13), pp 1231–1232, Mar. 26, 1990.

M.C. Ozturk., . . . into crystalline and ge preamorphized si, Appl. Phys. Lett. 52 (12), pp. 963–965, Mar. 21, 1988.

E. Ganin et al., "Shallow p+ junction formation by a reverse–type dopant preamorphization scheme", Appl. Phys. Lett. 54 (21), pp. 2127–2129, May 22, 1989.

S. Saito et al., "Defect reduction by MeV ion implantation for shallow junction formation", Appl. Phys. Lett. 63 (2), pp. 196–199, Jul. 12, 1993.

T.H. Huang et al., "Influence of fluorine preamorphization on the diffusion . . . ", Appl. Phys. Lett 65 (11), pp. 1829–1831, Oct. 3, 1994.

Y. Ono et al., "Segregation and . . . " Appl. Phys Lett 62 (4), pp. 375–377, Jan. 25, 1993.

A. Bousetta et al., "Si ultrashallow p+n junction using low–energy boron implantation", Appl. Phys. Lett 58 (15), pp. 1626–1628, Apr. 15,1991.

*Primary Examiner*—Charles Bowers
*Assistant Examiner*—Scott J. Hawranek

[57] ABSTRACT

Ultra shallow, low resistance LDD junctions are achieved by forming an LDD implant generating an interstitial-rich section and forming a sub-surface, non-amorphous region generating a vacancy-rich region substantially overlapping the interstitial rich region generated when forming the LDD implant. Embodiments include ion implanting, Ge or Si to form surface amorphous and sub-surface, non-amorphous regions, and implanting B or $BF_2$ to form the impurity region. Embodiments include forming the sub-surface, non-amorphous region before or after generating the surface amorphous region, and forming the impurity region before or after forming the sub-surface, non-amorphous region but after forming the surface amorphous region.

15 Claims, 6 Drawing Sheets

FORMATION OF LOW RESISTANCE, ULTRA SHALLOW LDD JUNCTIONS EMPLOYING A SUB-SURFACE, NON-AMORPHOUS IMPLANT

TECHNICAL FIELD

The present invention relates to a method of manufacturing a high density semiconductor device comprising low resistance, ultra shallow junctions. The invention has particular applicability in manufacturing high density semiconductor devices with design features of 0.18 microns and under.

BACKGROUND ART

The escalating requirements for high density and performance associated with ultra large scale integration semiconductor devices necessitate design features of 0.18 microns and under, increased transistor and circuit speeds, high reliability and increased manufacturing throughput. The reduction of design features to 0.18 microns and under challenges the limitations of conventional semiconductor manufacturing techniques.

As design features shrink to less than about 0.18 microns, it is necessary to significantly reduce the depth of the source and drain regions below the surface of the semiconductor substrate, particularly the lightly doped source/drain (LDD) regions, i.e., the junction depth ($X_J$). For example, in forming a polycrystalline silicon gate having a width of about 0.18 microns and under, the junction depth ($X_J$) should not exceed about 700 Å for reducing short channel effects associated with small gate length MOSFETs. However, the formation of a shallow $X_J$ less than about 700 Å exhibiting low-sheet resistance employing conventional semiconductor manufacturing methodology is problematic.

Conventional methodology comprises implanting boron (B) or boron difluoride ($BF_2$) into regions of a crystalline silicon semiconductor substrate and activation annealing to form P-type source/drain regions. B ions are implanted at an energy selected to determine the eventual $X_J$, and at a dosage selected to control the desired concentration. As B is an extremely light element, it must be implanted at a very low energy in order to achieve a shallow $X_J$. Accordingly, B is typically implanted at an energy of about 5 KeV.

It has been found, however, that B and $BF_2$ exhibit considerable channeling even during relatively low energy ion implantation. In addition, upon subsequent activation annealing, B and $BF_2$ diffusion through crystalline silicon proceed apace, such that the junction depth of B exceeds the target $X_J$ of no greater than about 700 Å. The problem of undefined $X_J$ is believed to stem from various factors, including channeling and diffusion. For example, B implantation is believed to damage the monocrystalline silicon substrate generating interstitial silicon (Si) atoms, i.e., Si atoms that are displaced from the monocrystalline lattice to occupy spaces between Si atoms in the monocrystalline lattice. During the high temperature activation anneal, B diffuses into the monocrystalline Si layer by attaching to the generated interstitial Si atoms, causing an extremely rapid diffusion of B into the monocrystalline Si layer. Such a rapid B diffusion causes the dopant profile and, hence, $X_J$, to extend below the targeted maximum of 700 Å, i.e., to a $X_J$ of about 2000 Å or deeper, notwithstanding the low initial implantation energy of about 5 KeV.

A previous approach to the undefined $X_J$ problem is disclosed in copending application Ser. No. 08/726,113 and comprises initially forming a surface amorphous region in the monocrystalline Si substrate. The surface amorphous region is formed by ion implanting appropriate neutral impurities, such as germanium (Ge) or Si. B is then ion implanted into the essentially amorphous Si region which does not contain any appreciable amount of interstitial Si atoms to which B would otherwise attach. Accordingly, upon subsequent activation annealing, rapid diffusion of B by transient enhanced diffusion is not significant due to the substantial lack of interstitial Si atoms. Therefore, the $X_J$ can be controlled by appropriate selection of the implantation energy. During activation annealing, the amorphous region is crystallized by solid phase epitaxy.

It was found, however, that end-of-range damage, e.g., defects comprising dislocations and stacking faults, occurs upon crystallization of the surface amorphous region during activation annealing. Such end-of-range defects are present in a subsequently formed depletion layer resulting in leakage. In copending application Ser. No. 08/992,629 a method is disclosed wherein a sub-surface, non-amorphous region is formed before activation annealing to substantially eliminate end-of-range defects generated upon crystallization of a shallow amorphous region containing the lightly doped implants.

Continued miniaturization below 0.18 microns necessitates reliable formation of ultra shallow but low-resistant junctions to achieve low off-state leakage by suppressing the short channel effects and a high drive current. Accordingly, there exists a need for semiconductor methodology enabling the formation of low resistance, shallow LDD junctions with reduced channeling and reduced transient enhanced diffusion. There exists a particular need for semiconductor technology enabling the formation of low resistance, ultra shallow LDD junctions having an acceptable leakage current and substantially reducing or eliminating transient enhanced diffusion linked to the generation of an interstitial-rich region attendant upon LDD implantation.

DISCLOSURE OF THE INVENTION

An advantage of the present invention is a method of manufacturing a high density semiconductor device having a low resistance, ultra shallow X.

Another advantage of the present invention is a method of manufacturing a high density semiconductor device with design features of 0.18 microns and under, and a low resistance, ultra shallow $X_J$.

Additional advantages and other features of the present invention will be set forth in part in the description which follows and in part will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantages are achieved in part by a method of manufacturing a semiconductor device, the method comprising: forming a surface amorphous region extending from and below a major surface of a semiconductor substrate, the amorphous region having a peak impurity concentration at a first depth from the major substrate surface; forming a dopant impurity region, a major portion of which is within the amorphous region, the dopant impurity region having a peak impurity concentration at a second depth from the major substrate surface; forming a sub-surface, non-amorphous region extending below, but not extending from, the major surface of the surface of the semiconductor substrate, wherein the non-amorphous region has a peak impurity concentration at a third depth from the major substrate surface greater than the first and second depths; and activation annealing to form lightly doped source/drain regions extending below the major surface of the semiconductor surface and having a junction depth ($X_J$).

Another aspect of the present invention is a method of manufacturing a semiconductor device, the method comprising: ion implanting Si or Ge to form a surface amorphous region extending from and below the major surface of a semiconductor substrate, the amorphous region having a peak impurity concentration at a first depth below the major substrate surface; ion implanting B or $BF_2$ to form a dopant impurity region a major portion of which is within the amorphous region, the dopant impurity region having a peak impurity concentration at a second depth below the major substrate surface and generating an interstitial-rich region; ion implanting Si or Ge to form a sub-surface, non-amorphous region extending below, but not extending from, the major surface of a semiconductor substrate, wherein the non-amorphous region has a peak impurity concentration at a third depth below the major substrate surface greater than the first and second depths and generates a vacancy-rich region substantially overlapping the interstitial-rich region generated when forming the impurity region; and activation annealing to form lightly doped source/drain regions extending below the major surface of the semiconductor substrate and having a junction depth of about 400 Å to about 700 Å, wherein the amorphous region reduces channeling of B or $BF_2$ and the sub-surface, non-amorphous region reduces transient enhanced diffusion of B or $BF_2$.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention addresses problems attendant upon manufacturing semiconductor devices satisfying the requirements for scaling down features to 0.18 microns and under, particularly problems involved in forming ultra shallow junctions having low sheet resistance. Ultra shallow junctions are necessary to reduce short channel effects for small gate MOSFETs. Conventional practices employing B or $BF_2$ implants are problematic with respect to forming low-sheet resistance, ultra shallow P-type junctions. For example, B is an extremely light ion and characteristically channels during implantation. In addition, B diffusion is enhanced by the presence of interstitials generated by the actual LDD implantation. The present invention addresses the problems of leakage as well as channeling and transient enhanced diffusion of P-type impurities, particularly B and $BF_2$. Accordingly, the present invention enables the formation of low-sheet resistance, ultra shallow P-LDD junctions of under 700 Å. The present invention, indeed, enables formation of an $X_J$ of about 400 Å to about 700 Å.

The above technical advantages of the present invention are achieved by the strategic formation of a shallow amorphous region extending from the major surface of a semiconductor substrate and a sub-surface, non-amorphous region which generates vacancies overlapping the interstitials generated by the P-LDD implant. The shallow amorphous region is optimized to reduce leakage and channeling of the P-dopant, while the non-amorphous region effectively suppresses transient enhanced diffusion, in that the vacancy-rich region generated by ion implantation to form the non-amorphous region substantially overlaps with and, hence, annihilates the interstitial-rich region created by the P-LDD implant. Upon subsequent activation annealing, the $X_J$ typically extends to a depth of about 400 Å to about 700 Å.

When practicing the present invention, any P-dopant can be employed, particularly B or $BF_2$. In forming the amorphous and sub-amorphous regions, any Group IV element can be employed, such as Si or Ge. It was found that the use of Ge is particularly advantageous due to its heavier mass, thereby achieving a lower leakage current.

Figure 1:
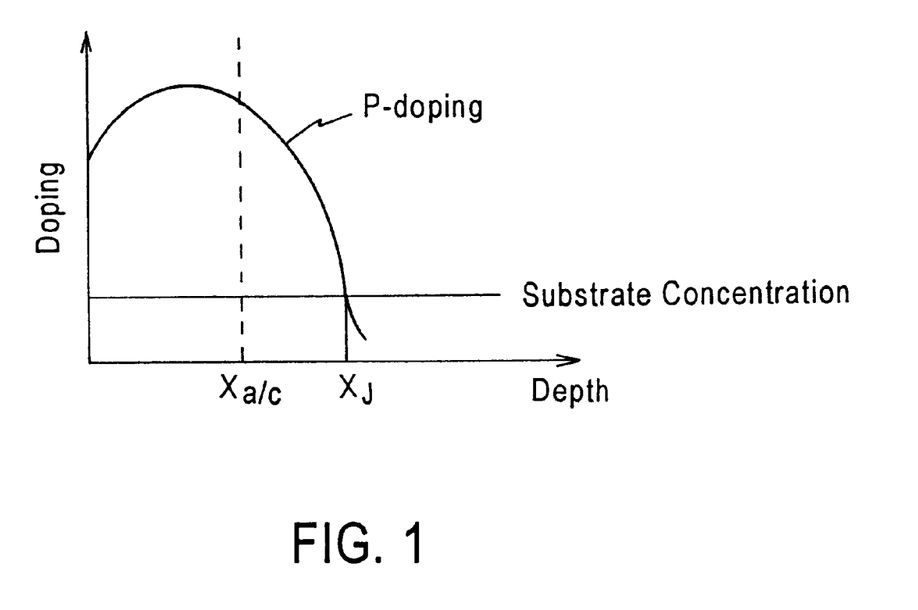
FIG. 1 illustrates the P-doping profile with respect to the amorphous/crystalline interface.

The precise mechanism involved in the present invention which provides the technical advantage of forming a low-sheet resistance, ultra shallow $X_J$ of about 400 Å to about 700 Å consistent with escalating miniaturization demands is not known with certainty. However, it is believed that the junction leakage is inversely proportional to $X_J$ minus the depth of amorphous/crystalline interface generated by the shallow amorphous implant ($X_{a/c}$). Adverting to FIG. 1, the shallow amorphous implant is optimized to a sufficiently shallow depth to minimize the leakage current while, at the same time, a sufficient amount of the P-dopant is implanted within the amorphous region for improved activation of the P-dopant. The amorphous region also suppresses P-dopant channeling.

Figure 2:
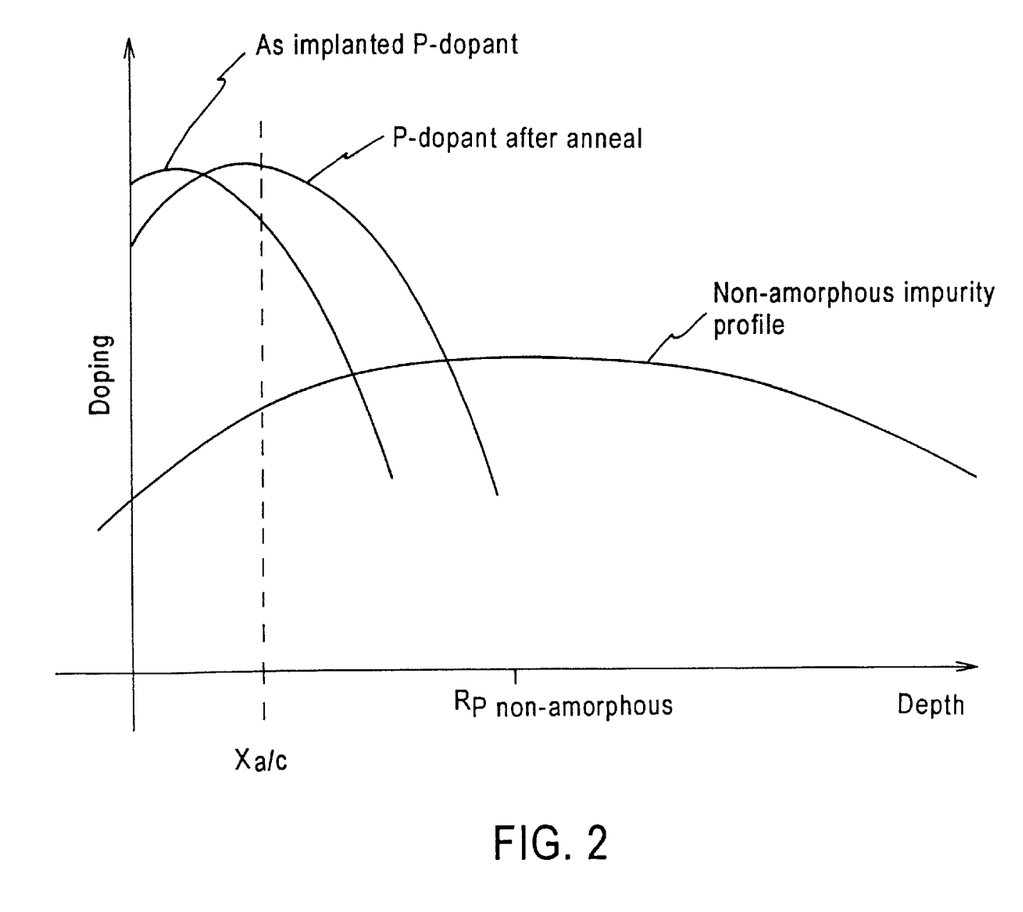
FIG. 2 illustrates the doping profiles for the P-impurities as implanted and after activation annealing with respect to the sub-amorphous profile and surface amorphous region.

Adverting to FIG. 2, the projected range for the peak impurity concentration ($R_p$) of the non-amorphous implant is selected to be greater than the depth of the P-dopant profile in the absence of the non-amorphous implant in order to minimize interaction between the P-dopant and the interstitials produced by the non-amorphous implant. The vacancy-rich region of the non-amorphous implant recombines with interstitials generated by the P-dopant implant, thereby significantly reducing or eliminating transient enhanced diffusion. Thus, the present invention achieves the technical advantage of enabling the formation of a semiconductor device having a low-sheet resistant, ultra shallow $X_J$, e.g., about 400 Å to about 700 Å, employing a strategically designed shallow amorphization implant with a deep non-amorphous implant. Advantageously, the present invention enables the use of a low temperature activation anneal of about 500° C. to about 600° C. when activating to form the lightly doped source/drain regions.

Given the guidance of the present disclosure, the implantation conditions can be optimized in a particular situation.

For example, in practicing the present invention, it has been found suitable to implant Si or Ge to form the shallow amorphous region such that the $R_p$ is at a depth of about 50 Å to about 150 Å, e.g., about 100 Å, implant B or $BF_2$ to form the LDD implant such that the $R_p$ is at a depth of about 50 Å to about 200 Å, and implant Si or Ge to form the deep non-amorphous region such that the $R_p$ is at a depth of about 500 Å to about 900 Å, thereby achieving, after activation annealing, an $X_J$ of about 400 Å to about 700 Å. In so doing, Si or Ge can be implanted at an energy of about 10 KeV to about 30 KeV, e.g., about 10 KeV to about 20 KeV, at a dosage of about $1\times10^{15}$ to about $5\times10^{15}$, e.g., about $1\times10^{15}$ atoms/cm$^2$ to about $3\times10^{15}$ atoms/cm$^2$. B and $BF_2$ can be implanted at a dosage of about $1\times10^{14}$ to about $2\times10^{15}$ atoms/cm$^2$, e.g., about $1\times10^{14}$ to about $9\times10^{14}$ atoms/cm$^2$. B can be implanted at an energy of about 0.5 KeV to about 2 KeV, e.g., about 0.5 KeV to about 1 KeV, while $BF_2$ can be implanted at an energy of about 1 KeV to about 5 KeV, e.g., 1 KeV to about 3 KeV. Si or Ge can be implanted to form the deep non-amorphous region at an energy of about 40 KeV to about 80 KeV, e.g., 50 KeV to about 70 KeV, at a dosage of about $1\times10^{14}$ to about $8\times10^{14}$ atoms/cm$^2$, e.g., about $2\times10^{14}$ to about $5\times10^{14}$ atoms/cm$^2$. In the embodiments of the present invention, ion implantation to form the shallow amorphous region is conducted prior to ion implantation of the P-dopant to form the P-LDD implant. Thus, embodiments of the present invention comprise sequentially:

(1) forming the shallow amorphous implant, forming the P-type dopant implant, and forming the deep non-amorphous implant;

(2) forming the shallow amorphous implant, forming the deep non-amorphous implant, and forming the P-type dopant implant; and (3) forming the deep non-amorphous implant, forming the shallow amorphous implant, and forming the P-type dopant implant.

In accordance with the present invention, the main, i.e., moderate or heavily doped, source/drain regions are preferably formed, prior to LDD implantation, as by forming sidewall spacers on a gate electrodes stack, ion implanting impurities and high temperature activation annealing. Thus, when activating to form the lightly doped source/drain region, a low temperature anneal can be formed, thereby minimizing diffusion and maintaining an ultra shallow $X_J$.

Generally, the dose threshold for Si amorphization is $1\times10^{15}$ atoms/cm$^2$ for Si implantation and $3\times10^{14}$ atoms/cm$^2$ for Ge implantation. Thus, in practicing the present invention utilizing a Si semiconductor substrate, and forming the sub-surface, non-amorphous ion implanted regions with Si or Ge, the ion implantation dose is lower than the respective amorphous doses.

Figure 3:
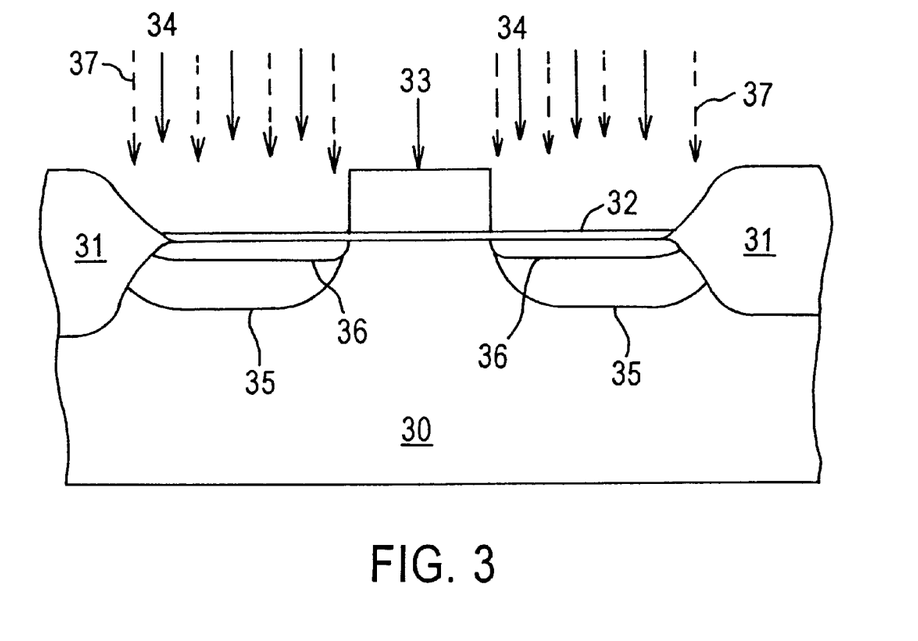
FIGS. 3–5 schematically illustrate sequential phases in accordance with an embodiment of the present invention.
Figure 4:
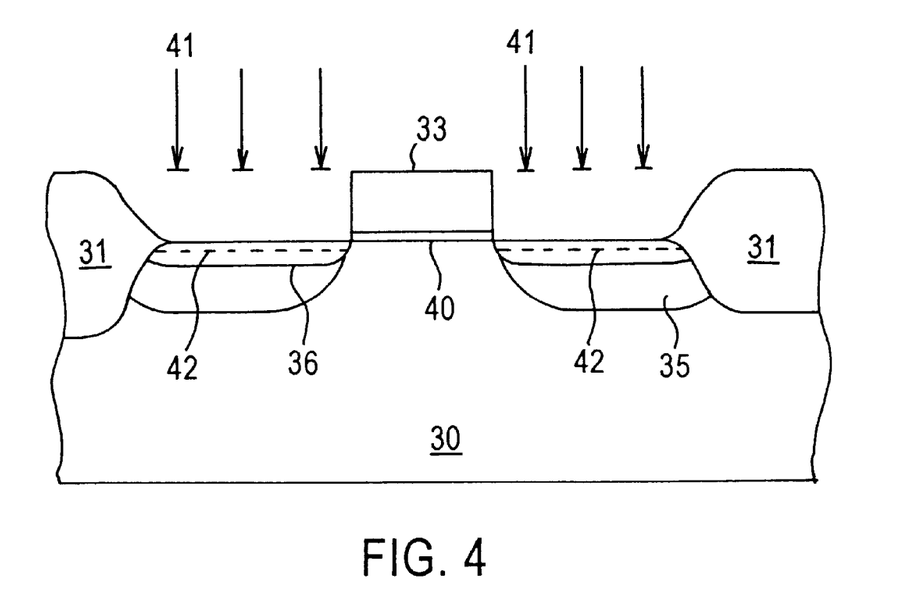
Figure 5:
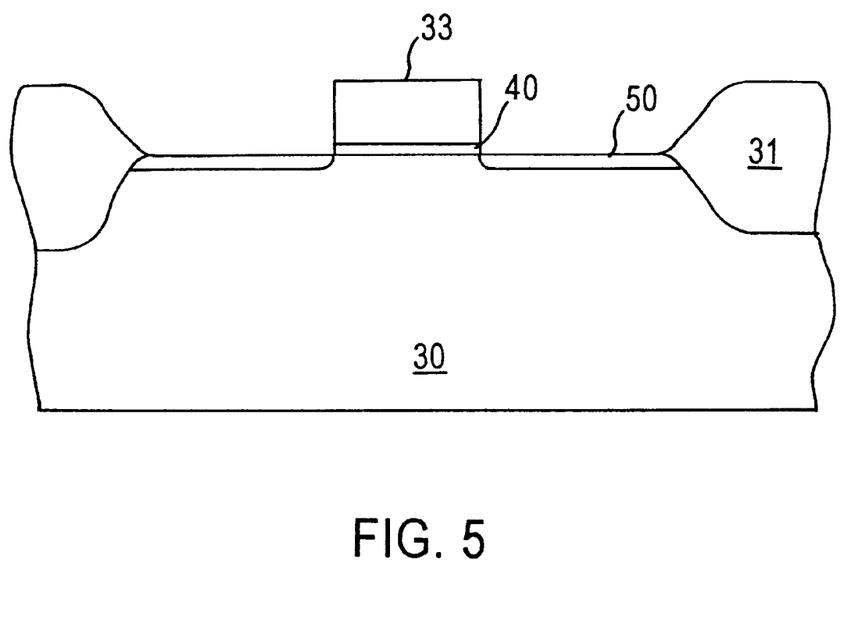

An embodiment of the present invention is schematically illustrated in FIGS. 3 through 5, wherein similar reference numerals denote similar features. As is shown in FIG. 3, semiconductor substrate 30 comprises an N- or P-type doped, monocrystalline Si, or an N- or P-well formed in a P- or N-doped, respectively, semiconductor substrate. Field oxide region 31 is formed to isolate an active region and an oxide layer 32 is formed on the surface of semiconductor substrate 30. A layer of conductive material, such as polycrystalline Si, is formed on dielectric layer 32 and patterned to form gate electrode 33. Ion implantation is then conducted, as shown by arrows 34, using gate electrode 33 as a mask, to form sub-surface, non-amorphous region 35 extending below, but not from, the major surface of the semiconductor substrate such that the $R_p$ has a depth of about 500 Å–900 Å. Ion implantation is also conducted, as shown by dashed arrow 37, to form surface amorphous region 36 extending from and below the major surface of semiconductor substrate 30 such that the $R_p$ has a depth of about 50 Å to about 150 Å. In forming surface amorphous region 36, a lower implantation energy and higher dosage is employed vis-à-vis the implantation energy and dosage employed when forming sub-surface, non-amorphous region 35. In carrying out various embodiments of the present invention, surface amorphous region 36 can be formed before or after forming sub-surface non-amorphous region 35.

Adverting to FIG. 4, dielectric layer 32 is patterned to form gate oxide layer 40. Ion implantations to form the sub-surface and surface amorphous regions can be conducted prior or subsequent to patterning the dielectric layer 32 to form gate dielectric layer 40. Dopant impurities, e.g., B, are then ion implanted, as indicated by arrows 41, to form LDD implants 42 substantially overlapping surface amorphous region 36, such that the $R_p$ is at a depth of about 50 Å to about 200 Å. In forming LDD implants 42, an interstitial-rich region is generated substantially overlapping a vacancy-rich region generated on forming sub-surface, non-amorphous region 35. As a result of such overlap, the interstitials in the interstitial-rich region are substantially annihilated. Activation annealing is then conducted at a temperature of about 500° C. to about 600° C. to form lightly doped source/drain regions 50, as shown in FIG. 5.

Figure 6:
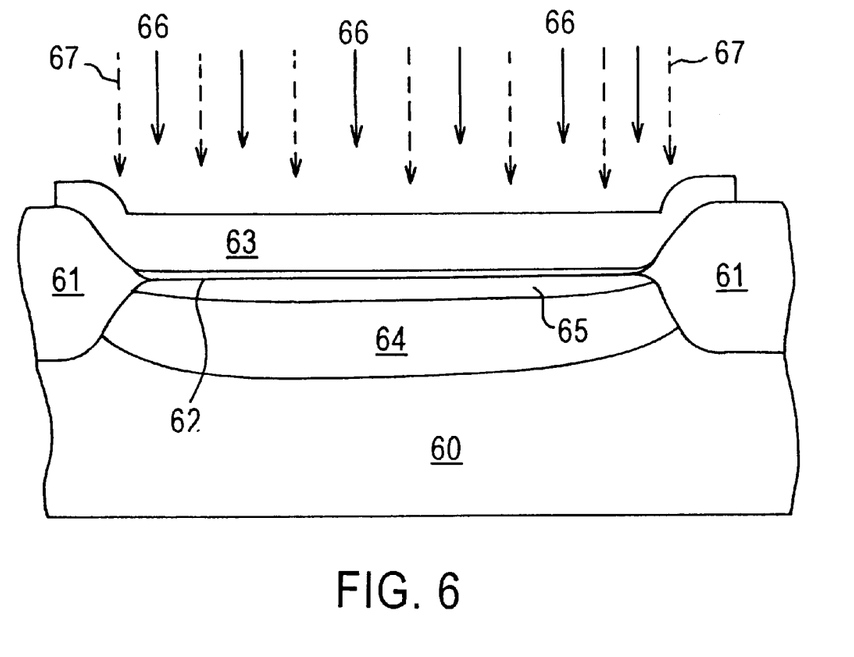
FIGS. 6–8 schematically illustrate sequential phases in accordance with another embodiment of the present invention.
Figure 7:
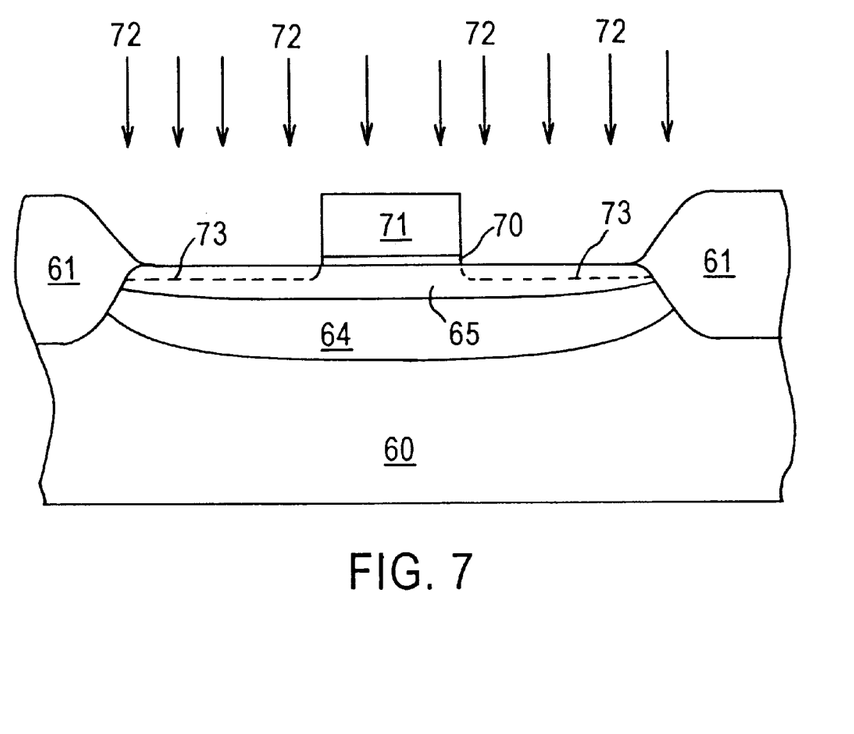
Figure 8:
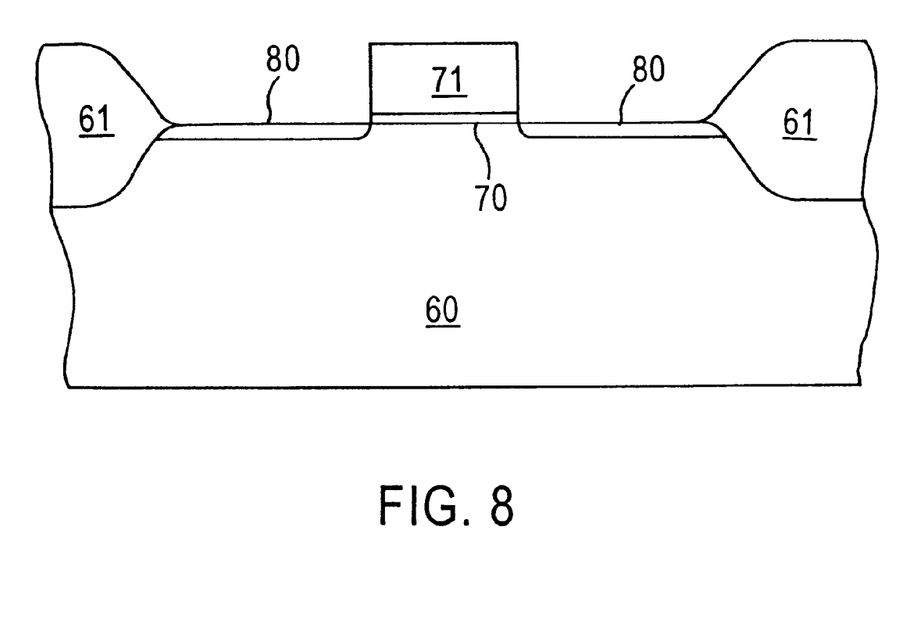

Another embodiment of the present invention is schematically illustrated in FIGS. 6 through 8, wherein similar reference numerals denote similar features. Adverting to FIG. 6, field oxide region 61 is formed in the surface of semiconductor substrate 60 to isolate an active region. A dielectric layer 62, such as Si oxide, is formed on the surface of Si substrate 60. Conductive layer 63, e.g., polycrystalline Si, is formed on dielectric layer 62. A neutral impurity, such as Ge, is implanted through polycrystalline layer 63 and Si oxide layer 62 into semiconductor substrate 60, as shown by dashed arrow 37, to form sub-surface, non-amorphous Si region 64. Ge atoms are also ion implanted through polycrystalline Si layer 63 and Si oxide layer 62 to form shallow surface amorphous Si region 65. Sub-surface, non-amorphous region 64 can be formed prior or subsequent to formation of surface amorphous region 65. A vacancy-rich interstitial region is formed between sub-surface non-amorphous Si region 64 and the main surface of the semiconductor substrate.

Adverting to FIG. 7, polycrystalline Si layer 63 and Si oxide layer 62 are patterned to form gate electrode 71 on semiconductor substrate 60 with gate dielectric layer 70 therebetween. Dopant impurities, such as B, are then ion implanted, as indicated by arrows 72, to form P-LDD implants 73 substantially overlapping or within shallow amorphous region 65. On forming P-LDD implants 73, an interstitial-rich region is formed substantially overlapping the vacancy-rich region generated on forming the sub-surface non-amorphous Si region 64. As a result of such an overlap, the interstitials are substantially annihilated. Activation annealing is then conducted at a temperature of about 500° C. to about 600° C. to form lightly doped source/drain regions 8, shown in FIG. 8, at an ultra shallow $X_J$ no greater than about 700 Å from the major surface of the semiconductor substrate.

Embodiments of the present invention include formation of the main source/drain region, i.e., a moderate or heavily doped region, prior to formation of the lightly doped source/drain region having an ultra shallow $X_J$ utilizing sidewall spacers on the gate electrode and a high temperature activation anneal. Accordingly, when forming the lightly doped source/drain regions having an ultra shallow junction depth, it is not necessary to expose the implanted impurities to a high temperature causing an undesirable increase in $X_J$.

In carrying out embodiments of the present invention, the conductive layer can comprise any of various conductive materials typically employed in the manufacture of semiconductor devices, and is not limited to polycrystalline Si. Similarly, the dielectric layer employed as the gate dielectric layer is not confined to Si oxide.

The present invention provides various technical advantages, notably enabling manufacture of semiconductor devices having a design rule of about 0.18 microns and under with ultra shallow junctions exhibiting low heat resistance. Thus, a $X_J$ of about 400 Å to about 700 Å is achieved thereby reducing short channel effects for small gate lengths MOSFETs. Heavy elements, such as Ge and Si, are ion implanted to form a shallow surface amorphous region and a deep non-amorphous region at appropriate $R_p$ depths to enable significant reduction in leakage current as well as P-impurity channeling and transient enhanced diffusion.

The present invention is applicable to the production of various types of semiconductor devices, particularly high density semiconductor devices with submicron features of about 0.18 microns and below, exhibiting high speed characteristics and improved reliability. The present invention is cost-effective and can easily be integrated into conventional processing.

Only the preferred embodiment of the present invention and an example of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   forming a surface amorphous region extending from and below a major surface of a semiconductor substrate, the amorphous region having a peak impurity concentration at a first depth from the major substrate surface;
   ion implanting a P-type impurity to form a dopant impurity region and generate an interstitial-rich region, a major portion of which is within the amorphous region, the dopant impurity region having a peak impurity concentration at a second depth from the major substrate surface;
   ion implanting to form a sub-surface, non-amorphous impurity region extending below, but not extending from, the major surface of the semiconductor substrate, and a vacancy-rich region substantially overlapping the interstitial-rich region generated when forming the dopant impurity region, wherein the non-amorphous impurity region has a peak impurity concentration at a third depth from the major substrate surface greater than the first and second depths; and
   activation annealing to form lightly doped source/drain regions extending below the major surface of the semiconductor surface and having a junction depth ($X_J$).

2. The method according to claim 1, comprising ion implanting a Group IV element to form the amorphous and non-amorphous impurity regions.

3. The method according to claim 2, comprising ion implanting Si or Ge to form the amorphous region and implanting Si or Ge to form the non-amorphous impurity region.

4. The method according to claim 1, wherein:
   the amorphous region reduces channeling of the P-type impurities; and
   the sub-surface, non-amorphous impurity region reduces transient enhanced diffusion of the P-type impurities.

5. The method according to claim 4, wherein the $X_J$ is about 400 Å to about 700 Å.

6. The method according to claim 5, wherein:
   the first depth is about 50 Å to about 150 Å;
   the second depth is about 50 Å to about 200 Å; and
   the third depth is about 500 Å to about 900 Å.

7. The method according to claim 4, comprising:
   ion implanting Si or Ge at an energy of about 10 KeV to about 30 KeV at a dosage of about $1 \times 10^{15}$ to about $5 \times 10^{15}$ atoms/cm$^2$ to form the amorphous region;
   ion implanting B at an energy of about 0.5 KeV to about 2 KeV at a dosage of about $1 \times 10^{14}$ to about $2 \times 10^{15}$ atoms cm$^{-2}$ or ion implanting BF$_2$ at an energy of 1 KeV to about 5 KeV at a dosage of about $1 \times 10^{14}$ to about $2 \times 10^{15}$ atoms/cm$^{-2}$, to form the impurity region; and
   ion implanting Si or Ge at an energy of about 40 KeV to about 80 KeV at a dosage of about $1 \times 10^{14}$ to about $8 \times 10^{14}$ atoms/cm$^2$ to form the non-amorphous impurity region.

8. The method according to claim 7, comprising:
   ion implanting Si or Ge at an energy of about 10 KeV to about 20 KeV at a dosage of about $1 \times 10^{15}$ to about $3 \times 10^{15}$ atoms/cm$^2$ to form the amorphous region;
   ion implanting B at an energy of about 0.5 KeV to about 1 KeV at a dosage of about $1 \times 10^{14}$ to about $9 \times 10^{14}$ atoms/cm$^2$, or ion implanting BF$_2$ at an energy of about 1 KeV to about 3 KeV at a dosage of about $1 \times 10^{14}$ to about $9 \times 10^{14}$ atoms/cm$^2$ to form the impurity region; and
   ion implanting Si of Ge at an energy of about 50 KeV to about 70 KeV at a dosage of about $2 \times 10^{14}$ to about $5 \times 10^{14}$ atoms/cm$^2$ to form the non-amorphous impurity region.

9. The method according to claim 2, comprising, sequentially:
   forming the amorphous region;
   forming the impurity region; and
   forming the non-amorphous region.

10. The method according to claim 1, comprising, sequentially:
    forming the amorphous region;
    forming the non-amorphous impurity region; and
    forming the impurity region.

11. The method according to claim 1, comprising, sequentially:
    forming the non-amorphous region;
    forming the amorphous impurity region; and
    forming the impurity region.

12. The method according to claim 1, wherein the semiconductor device has a design rule of about 0.18 µm or under.

13. The method according to claim 1, comprising activation annealing at a temperature of about 500° C. to about 600° C.

14. A method of manufacturing a semiconductor device, the method comprising:
    ion implanting Si or Ge to form a surface amorphous region extending from and below a major surface of a semiconductor substrate, the amorphous region having a peak impurity concentration at a first depth below the major substrate surface;

ion implanting B or $BF_2$ to form a dopant impurity region a major portion of which is within the amorphous region, the dopant impurity region having a peak impurity concentration at a second depth below the major substrate surface and generating an interstitial-rich region;

ion implanting Si or Ge to form a sub-surface, non-amorphous impurity region extending below, but not extending from, the major surface of a semiconductor substrate, wherein the non-amorphous impurity region has a peak impurity concentration at a third depth below the major substrate surface greater than the first and second depths and generate a vacancy-rich region substantially overlapping the interstitial-rich region generated when forming the impurity dopant region; and activation annealing to form lightly doped source/drain regions extending below the major surface of the semiconductor substrate and having a junction depth of about 400 Å to about 700 Å, wherein the amorphous region reduces channeling of B or $BF_2$ and the sub-surface, non-amorphous impurity region reduces transient enhanced diffusion of B or $BF_2$.

15. The method according to claim 14, comprising activation annealing at a temperature of about 500° C. to about 600° C.

* * * * *